United States Patent [19]

Brunson

[11] 4,267,594
[45] May 12, 1981

[54] DECOMMUTATOR PATCHBOARD VERIFIER

[75] Inventor: John W. Brunson, Titusville, Fla.

[73] Assignee: The United States of America as represented by the Administrator of the National Aeronautics and Space Administration, Washington, D.C.

[21] Appl. No.: 51,271

[22] Filed: Jun. 22, 1979

[51] Int. Cl.³ .................... G01R 31/28; G06F 11/00
[52] U.S. Cl. ................................. 371/20; 371/25; 324/51; 324/73 AT
[58] Field of Search ............... 371/15, 20, 25, 26; 324/51, 73 R, 73 AT, 73 PC

[56] References Cited

U.S. PATENT DOCUMENTS

| | | | |
|---|---|---|---|
| 3,904,861 | 9/1975 | McNamara | 371/25 |
| 4,042,832 | 8/1977 | Cassarino, Jr. et al. | 324/51 |
| 4,114,093 | 9/1978 | Long | 324/73 AT |
| 4,174,805 | 11/1979 | Fulks et al. | 371/20 |
| 4,176,780 | 12/1979 | Sacher et al. | 371/25 |
| 4,194,113 | 3/1980 | Fulks et al. | 371/20 |

Primary Examiner—Charles E. Atkinson
Attorney, Agent, or Firm—James O. Harrell; John R. Manning

[57] ABSTRACT

A system for automatically verifying the connections between terminals of a patchboard. The system includes a back plane having a plurality of plugs provided therein corresponding to the pins of the patchboard so that the patchboard can be plugged therein. A plurality of decoders are connected to the plugs of the back plane so that a signal can be sequentially applied to each plug of the back plane under control of a stepping register and a control circuit. A plurality of data selectors are also connected to the plugs of the back plane and under control of a second external register and said control circuit sequentially make connections between an output circuit and the plugs of the back plane so as to patch the signal applied to a respective plug through a patch connection to the output circuit. By making the above connections in a controlled manner, the precise locations of the patches on the patchboard can be identified and compared with previously stored information in a memory unit.

6 Claims, 3 Drawing Figures

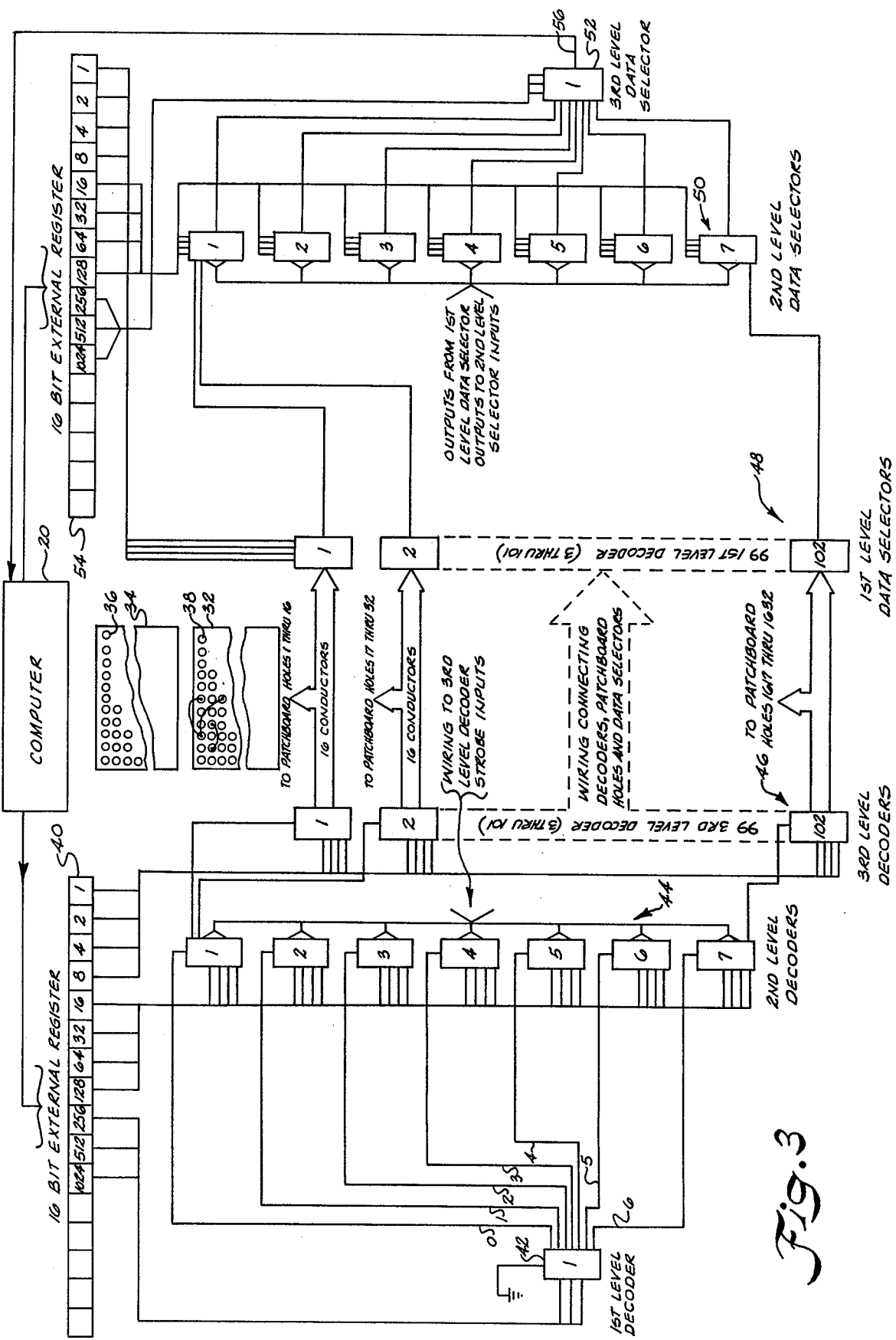

DECOMMUTATOR PATCHBOARD VERIFIER

ORIGIN OF THE INVENTION

The invention described herein was made by an employee of the U.S. Government and may be manufactured and used by or for the Government for governmental purposes without the payment of any royalties thereon or therefor.

BACKGROUND OF THE INVENTION

One of the problems encountered in checking out large systems such as space vehicles prior to a launch is that many measurements have to be taken in a relatively short period of time. This requires the transmission of signals to and receiving signals from the space vehicle. For the support of a space vehicle, there may be as many as 60,000 measurements from numerous tests that have to be performed prior to and during the launch of the space vehicle. In order to transmit the information from the space vehicle to control centers, the information is normally sent in the form of telemetary links which contain, in one particular instance, approximately 2400 measurements. These links are pulse coded modulated signals that once received at the control center must be decoded by a decommutator to identifyable measurements such as temperatures, pressures, fuel levels, vibration signals, etc.

In order to decode these links of pulse coded modulator signals, PCM patchboards in conjunction with decommutators are utilized. These patchboards are usually constructed of a plurality of holes defined by electrically conductive sleeves aligned in rows and columns. The particular manner in which it is patched for decoding the information includes physically connecting wires from one particular hole to another hole. On the backside of the patchboard, there are pins corresponding in number and location to the holes on the front side and being electrically connected thereto.

Normally, the program for the decommutator is made up many months in advance of the actual launch of the space vehicle and often the information patched in the patchboard will be altered either by accidentally bumping a lead or physical deterioration. If, prior to the launch of the space vehicle a patchboard is damaged, it would cause data to be processed erroneously or not processed at all. Malfunction of any one lead on a particular patchboard could possibly delay the launch of a space vehicle for an extended period of time.

As can be seen, it is critical that the patchboards utilized in the decommutators be verified prior to proceeding into the actual launch phase. Heretofore, this required many man hours in physically checking the terminals of the patchboard according to the program.

In U.S. Pat. No. 3,705,349, there is disclosed a computer controlled wiring network test system wherein the terminals on a panel are scanned under control of a computer for establishing the connections between the particular terminals.

In U.S. Pat. No. 3,878,405, there is disclosed switching circuitry for logical testing of network connections that utilize logic circuits for testing the continuity between buses. Similar circuits are disclosed in U.S. Pat. Nos. 3,500,457 and 3,665,299.

SUMMARY OF THE INVENTION

The invention relates to a verifier for a patchboard which includes a system comprising a computer having a memory, a comparator, a control circuit, and a synchronization circuit. Connected to the output of the computer is a printer which prints out the information regarding the status of the patchboard. The computer is utilized for analyzing and controlling the operation of the vertifier which includes external stepping registers having three levels of decoders that are, in turn, utilized for checking the individual pins of the patchboard. These pins are checked by sequentially sending signals to the individual pins in a controlled order. Also connected to the pins of the patchboard by means of a back plane which includes a plurality of sockets corresponding to the pins is a bank of data selectors. There are three levels of data selectors that are utilized for producing signals identifying the precise location of a pin and patching connections between pins on the patchboard. Connected to the output of a third level data selector is an output circuit that is connected to a memory forming part of the computer as well as to a comparator forming part of the computer.

It is understood that the memory of the computer is loaded with information stored according to the patching program of the initial patching of the patchboard. In many instances, this may be several months in advance of the actual verification of a patchboard. Immediately prior to utilizing the patchboard for controlling the decommutator and decommutating the PCM signals representing the information being received from a space vehicle during a test, the patchboard is plugged into a back plane forming part of a verifier.

Under control of the control circuit forming part of the computer, a stepping register is utilized for individually checking each terminal of the patchboard being physically tested. A second external register which is also under control of the computer is connected to the terminals of the patchboard through data selectors so that when a terminal connection is sensed, an output signal is produced from a third level data selector and fed back to the computer for being compared with the information previously stored in the memory representing terminal connection. If an error occurs, a comparator generates a signal that is fed to a printer as well as to the control circuit informing an operator of the abnormality.

Accordingly, it is an important object of the present invention to provide a relatively simple and fast system for checking out the terminal connections of a patchboard.

Another important object of the present invention is to provide a system which reduces the man hours required for physically checking the terminal connections of a patchboard.

Still another important object of the present invention is to provide an accurate reliable and speedy method for detecting errors in terminal connections of a patchboard and for providing an automatic device for indicating when an error so occurs.

These and other objects and advantages of the invention will become apparent upon reference to the following specifications, attendant claims and drawings.

BRIEF DESCRIPTION OF THE DRAWINGS

FIG. 3 is a more detailed block diagram of a system for verifying patchboards contructed in accordance with the present invention.

DESCRIPTION OF A PREFERRED EMBODIMENT

Figure 1:
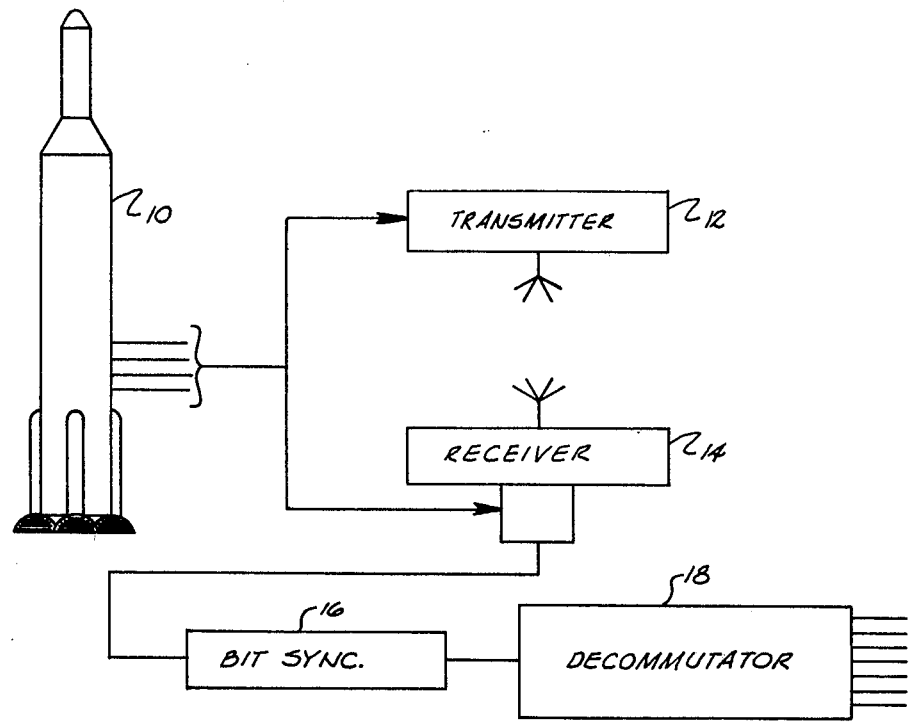
FIG. 1 is a block diagram illustrating a system in which patchboards that require verification is utilized.

Referring in more detail to the drawings, there is illustrated in FIG. 1, a space vehicle generally designated by the reference character 10. Prior to launching the space vehicle 10, many measurements have to be taken, and in certain instances, as many as 60,000 measurements pertaining to vibrations, fuel, temperature, etc. have to be taken. In order to take these measurements and analyze the information in a relatively short period of time, the signals are converted to pulse coded modulated signals and formed into links which may contain, in one particular instance, approximately 2400 signals per link, however, some links contain as many as 4000 measurements depending on the criteria of the system. These pulse-coded modulated signals are then fed to a transmitter 12 for being transmitted as a radio signal to a receiver 14 located at a remote location. Simultaneously, with transmission of the radio signals, a hardline link is normally connected between the sensors provided on the space vehicle and the remote location to verify the radio frequency (R.F.) signals being transmitted. After the receiver receives the R.F. signals, they are then fed through a bit synchronizer 16.

The bit synchronizer 16 is for signal conditioning; and after the signals have been conditioned, they are fed to a decommutator 18. The decommutator 18, in turn, produces from the pulse coded modulator signal a plurality of signals representing individual measurements on its output. In order to decommutate the pulse coded modulated signal, patchboards are utilized for each unique link. If, for some reason, the patchboard is not properly patched or has been tampered with, the decommutation of the PCM signal will not be performed properly. This could either produce false data or loss of data. As a result, it is important that the integrity of the patchboard be checked prior to being utilized in the actual launch of the space vehicle.

Figure 2:
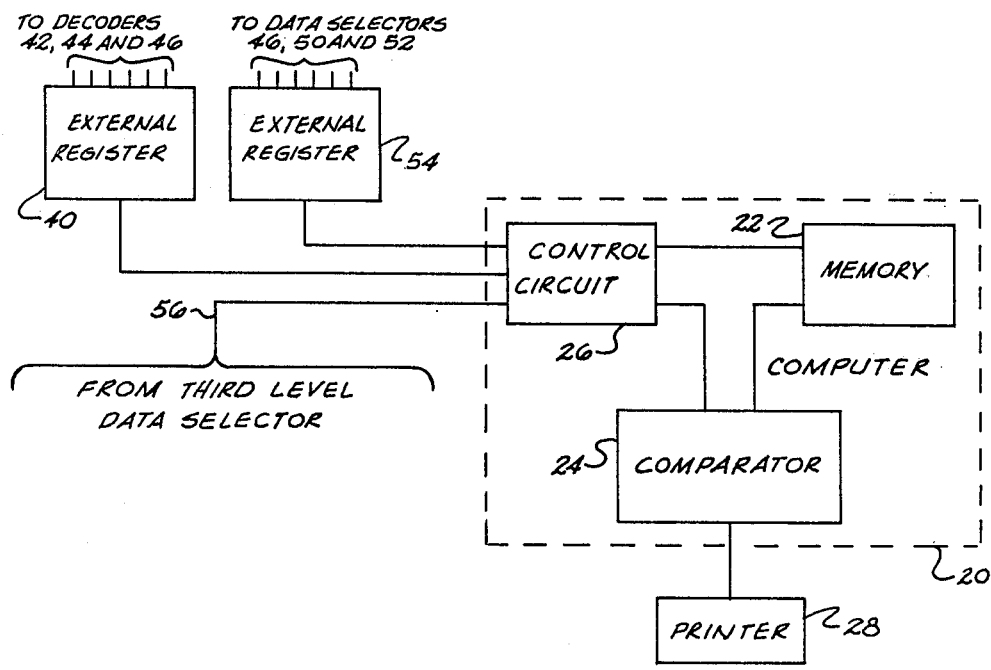
FIG. 2 is a block diagram of a patchboard verifying circuit constructed in accordance with the present invention.

Referring now to FIG. 2 of the drawings, there is illustrated a computer generally designated by the reference character 20 which includes a memory 22, a comparator 24, and a control circuit 26. Any suitable conventional computer programed in a conventional manner can be utilized for controlling the operation of the system. One suitable computer would be a computer similar to that shown in U.S. Pat. No. 4,114,093, sold by Intel Corporation under the designation SPC 80-10. Connected also to the computer is a printer 28 which prints out the information regarding the verification of the patchboard.

A patchboard 32 (FIG. 3) that is to be verified is physically plugged into a back plane 34 which contains sockets 36 corresponding to the pin locations 38 of the patchboard. Once the patchboard 32 has been plugged into the back plane, the computer 20 then begins the verification test. In the particular device illustrated, the patchboard 32 has 1632 pin locations that must be individually checked to verify proper patching.

In order to carry out this verification, the computer 20 is connected to a first stepping external register 40 that in the embodiment illustrated is a 16 bit register having 11 outputs. The outputs of the stepping register 40 are connected to three banks of decoders 42, 44 and 46, respectively. The first level decoder 42 is a single chip provided for decoding the three most significant bits of information of stepping register 40 representing bits 256, 512 and 1024. The second level of decoders 44 are seven chips decoding the next four most significant bits including bits 128, 63, 32, and 16 of stepping register 40. The third level decoders 46 include 102 chips which decode the four least significant bits from the stepping register 40.

As illustrated from the first level decoder, there are seven output leads identified by the reference characters 0 through 6. The purpose of the 0 lead is that if the first level decoder is not enabled by any of the bits 256, 512, and 1024, an output signal is produced on the output lead 0. It is noted that the output lead 0 of the first level decoder 42 is connected to an enabling input of the first chip (1) of the second level decoder for enabling the chip when the three most significant bits are 0. That implies that the information stored in the stepping register 40 is less than the number 256. The outputs from the second level decoders 44 are connected to the inputs of the third level decoders 46 in the identical manner as the outputs from the first level decoder 42 to the second level decoder as previously explained.

The outputs of the third level decoders 46 are directly connected to one of the plugs 36 of the back plane 34.

As illustrated on the right-hand side of FIG. 3, there is a first level of data selectors generally designated by the reference character 48 which includes 102 chip selectors. These chip selectors forming the first level data selector 48 are individually connected to the plugs of the back plane similar to the outputs of the third level decoders 46. The output of the first level data selectors 48 are, in turn, connected to input terminals of second level data selectors 50. There are seven chips of data selectors in the second level 50. A third level data selector 52 which has seven input terminals are respectively connected to the seven chips forming the second level data selectors 50.

The third level data selectors 52 have enabling inputs that are connected to the three most significant bits of an external register 54. The third level data selector 52 is also connected to an output circuit 56 that is, in turn, connected to a control circuit 26 of the computer 20. Signals are produced on output circuit 56 indicating connector or no-connector.

In order to indicate the flow of signals through the circuit during verification, let it be assumed that the patchboard is patched as illustrated. That is, there is a connection between terminal 3 of row 1 and terminal 6 of row 1. There is also a connection between terminal 3 of row 1 and terminal 6 of row 3 and a connection between terminal 2 of row 2 and terminal 4 of row 2.

The verification sequence first requires information to be stored in the memory 22 forming part of the computer indicating the actual connections of the patchboard 32. After this information has been stored in the memory of the computer, the same patchboard can be plugged back into the back plane 34 and the terminal connections can be compared with the information stored in the memory of the computer.

For the purpose of clarification, the terminals of the patchboard will be identified as terminals 1 through 1632. The normal procedure is to refer to them as a particular terminal in a row or column. Therefore, the terminal shown in the second row and the second column would be terminal 50.

Under control of the control circuit 26 of the computer 20, first the stepping register 40 sends a signal representing bit 1 to chip 1 of the third level of decoders for sampling the first terminal of the patchboard. Similarly, the control circuit 26 sends a signal to the external register 54 which will activate bit 2 of the external register 54 for looking to see if terminal 1 of the patchboard is connected to terminal 2 of the patchboard. The signals from the external stepping register 40 and the external register 54 are decoded through the decoders 42, 44 and 46 and the data selectors 48, 50 and 52 to produce either a signal or no signal on output circuit 56 of the third level data selector 52. Since there is no connection between terminals 1 and 2, a 0 signal is produced on output circuit 56 and fed to the computer for being stored in the memory. The stepping register 54 will continue stepping through the 1632 bits so as to check each terminal of the patchboard 32 to determine if there is connection between terminal 1 and any other terminal. After this has been done, then the stepping register 40 will move to the second bit applying a signal to terminal 2 of the patchboard and the external register 54 will step through bit terminals 1 through 1632, skipping terminal 2 to determine if there is connection therebetween. Since there is no connection to terminal 2, no signal is produced on output lead 56. The stepping register 40 then moves to the third bit and the sequence is repeated. Since there is a connection between terminal 3 and terminal 6 of the patchboard, when the external register 54 is stepped to the sixth position, it indicates a connection between terminal 3 and terminal 6 causing an output signal to be produced on output circuit 56. This signal is, in turn, fed into the computer 20 and stored in memory 22. The entire board is checked sequentially for storing the patching program of the patchboard therein.

After all the information has been stored in the memory and it is time to verify the patching of the patchboard at a later date, the same sequence is repeated with the exception of storing the information in the memory 22. However, during the verification process, for each signal produced on output circuit 56 of the third level data selector 52, the information previously stored in the memory 22 is fed to a comparator 24 for being compared with the output signal appearing on output circuit 56. If there is a comparison, the verification process continues. However, if there is an error between the information stored in the memory 22 and the information being produced during the verification of the patchboard 32, an error signal is produced by comparator 24 causing the printer 28 to identify the problem by row and column.

While a preferred embodiment of the invention has been described using specific terms, such description is for illustrative purposes only, and it is to be understood that changes and variations may be made without departing from the spirit or scope of the following claims.

What is claimed is:

1. A system for verifying the connections between terminals of a patchboard comprising:
   (a) a back plane;
   (b) a plurality of plugs provided in said back plane corresponding in number and position to said terminals of said patchboard so that said patchboard that is to be verified can be plugged therein;
   (c) a plurality of decoders connected to said plugs of said back plane;
   (d) a control circuit means;
   (e) memory means connected to said control circuit means, means for storing information in said memory means representing the correct patching program of said patchboard which is being verified;
   (f) first stepping register means connected between said control circuit means and said plurality of decoders for selectively supplying signals through said decoders to said plugs of said back plane under control of said control circuit means;
   (g) a plurality of data selector means connected to said plugs of said back plane;
   (h) an output circuit;
   (i) second stepping register means connected between said control circuit means and said plurality of data selector means for selectively making connection between said plugs through said data selector means to said output circuit causing a signal to be produced at said output circuit identifying the connections between the terminals of said patchboard,
   (j) comparator means connected to said memory means and output circuit for comparing signals produced at said output circuit with said information in said memory for verifying said connections between terminals of said patchboard; and
   (k) said plurality of decoders including:
      (i) first, second and third level decoders;
      (ii) each of said decoders having input and output terminals;
      (iii) means for connecting predetermined input terminals of said decoders to said first stepping register means;
      (iv) means for connecting said output terminals of said first level decoders to predetermined input terminals of said second level decoders;
      (v) means for connecting said output terminals of said second level decoders to predetermined input terminals of said third level decoders; and
      (vi) means for connecting said output terminals of said third level decoders to predetermined plugs of said back frame.

2. The system as set forth in claim 1 wherein said first stepping register means comprises:
   (a) a first multi-bit sequential stepping register having an input terminal and a plurality of output terminals representing bits of information of different significance;
   (b) means for connecting said input terminal of said first stepping register to said control circuit means for sequentially stepping said first stepping register responsive to receiving signals from said control circuit means;
   (c) means for connecting predetermined output terminals of said first stepping register representing least significant bits of information to predetermined input terminals of said third level decoders;
   (d) means for connecting predetermined output terminals of said first stepping register representing the next most significant bits of information to predetermined input terminals of said second level decoders, and
   (e) means for connecting predetermined output terminals of said first stepping register representing the most significant bits of information to predetermined input terminals of said first level decoders.

3. The system as set forth in claim 1 wherein said plurality of data selector means comprises:
   (a) first, second and third level data selectors;

(b) each of said data selectors having input, output, and control terminals;

(c) means for connecting predetermined control terminals of said data selectors to said second stepping register means;

(d) means for connecting said output terminals of said first level data selectors to predetermined input terminals of said second level data selectors;

(e) means for connecting said output terminals of said second level data selectors to predetermine input terminals of said third level data selectors; and (f) means for connecting said output terminal of said third level data selector to said output circuit.

4. The system as set forth in claim 3 wherein said second stepping register means comprises:

(a) a second multi-bit sequential stepping register having an input terminal and a plurality of output terminals representing bits of information of different significance;

(b) means for connecting said input terminal of said second stepping register to said control circuit means for sequentially stepping said stepping register responsive to receiving signals from said control circuit means, (c) means for connecting predetermined output terminals of said second stepping register representing least significant bits of information to predetermined input terminals of said first level data selectors, (d) means for connecting predetermined output terminals of said second stepping register representing the next most significant bits of information to predetermined input terminals of said second level data selectors; and (e) means for connecting predetermined output terminals of said second stepping register representing the most significant bits of information to predetermined input terminals of said third level decoders.

5. The system as set forth in claim 1 further comprising:

(a) an output terminal provided on said comparator means for receiving signals indicating whether the information appearing on the output circuit matches the information stored in said memory means, (b) a printer connected to the output terminal of said comparator means for recording the information produced thereon.

6. A system for verifying the connection between terminals of a patchboard comprising:

(a) a back plane, (b) a plurality of plugs provided in said back plane corresponding in number and position to said terminals of said patchboard so that said patchboard that is to be verified can be plugged therein;

(c) a plurality of decoders being connected to said plugs of said back plane;

(d) a control circuit means;

(e) memory means connected to said control circuit means;

(f) means for storing information in said memory means representing the correct patching program of said patch board which is being verified;

(g) first stepping register means connected between said control circuit means and said plurality of decoders for selectively supplying signals through said decoders to said plugs of said back plane under control of said control circuit means, (h) a plurality of data selector means connected to said plugs of said back plane;

(i) an output circuit;

(j) second stepping register means connected between said control circuit means and said plurality of data selector means for selectively making connection between said plugs through said data selector means to said output circuit causing a signal to be produced at said output circuit identifying said connections between said terminals of said patchboard;

(k) said control circuit means synchronizing the stepping of said first stepping register with said second stepping register so that as a signal is sequentially supplied from said first stepping register to each plug of said back plane and while said signal is being supplied to a particular plug connection in sequentially made between said output circuit and every other plug of said back plane so as to determine if there is a patch between said particular plug and any other plug.

* * * * *